(12) United States Patent
Oliver et al.

(10) Patent No.: US 7,919,230 B2
(45) Date of Patent: Apr. 5, 2011

(54) THERMAL EMBOSSING OF RESIST REFLOWED LENSES TO MAKE ASPHERIC LENS MASTER WAFER

(75) Inventors: Steve Oliver, San Jose, CA (US); Shashikant Hegde, Boise, ID (US); Jeff Viens, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 540 days.

(21) Appl. No.: 12/213,837

(22) Filed: Jun. 25, 2008

(65) Prior Publication Data

US 2009/0325107 A1 Dec. 31, 2009

(51) Int. Cl.
G02B 3/02 (2006.01)

(52) U.S. Cl. ............. 430/321; 216/26; 264/2.5; 264/2.7

(58) Field of Classification Search .................. None
See application file for complete search history.

(56) References Cited

U.S. PATENT DOCUMENTS

| | | | |
|---|---|---|---|
| 6,049,430 A | 4/2000 | Heanue et al. | |
| 6,410,213 B1 | 6/2002 | Raguin et al. | |
| 6,632,342 B1 | 10/2003 | Teshima et al. | |
| 6,898,015 B2 | 5/2005 | Yoshikawa et al. | |
| 6,994,951 B1 * | 2/2006 | Chen et al. | 430/320 |
| 7,042,645 B2 | 5/2006 | Houlihan et al. | |
| 7,092,165 B2 | 8/2006 | Morris et al. | |
| 7,129,027 B2 | 10/2006 | Nakajima | |
| 2003/0003186 A1 | 1/2003 | Border et al. | |
| 2003/0119962 A1 | 6/2003 | Border et al. | |
| 2003/0127759 A1 | 7/2003 | Border et al. | |
| 2004/0146807 A1 | 7/2004 | Lee et al. | |
| 2004/0264856 A1 | 12/2004 | Farr | |
| 2005/0074702 A1 | 4/2005 | Lee et al. | |
| 2005/0152043 A1 | 7/2005 | Tang | |
| 2006/0029890 A1 | 2/2006 | Ulrich et al. | |
| 2006/0046204 A1 | 3/2006 | Ono et al. | |
| 2006/0139758 A1 | 6/2006 | Segawa et al. | |
| 2006/0176583 A1 | 8/2006 | Jin et al. | |
| 2006/0177959 A1 | 8/2006 | Boettiger et al. | |
| 2006/0214203 A1 | 9/2006 | Li et al. | |
| 2006/0254318 A1 | 11/2006 | Dona et al. | |
| 2006/0273478 A1 | 12/2006 | Jin et al. | |
| 2007/0029277 A1 | 2/2007 | Jacobowitz et al. | |
| 2007/0030570 A1 | 2/2007 | Jacobowitz et al. | |
| 2007/0046862 A1 | 3/2007 | Umebayashi et al. | |
| 2007/0121212 A1 | 5/2007 | Boettiger et al. | |
| 2007/0217019 A1 | 9/2007 | Huang et al. | |
| 2007/0226452 A1 | 9/2007 | Wu et al. | |
| 2007/0263291 A1 | 11/2007 | Whitehead | |

(Continued)

FOREIGN PATENT DOCUMENTS

CN 1979884 A 6/2007

(Continued)

OTHER PUBLICATIONS

Computer-generated translation of JP 7-104106 (Apr. 1995).*

(Continued)

*Primary Examiner* — John A. McPherson

(57) ABSTRACT

Methods of forming a lens master wafer having aspheric lens shapes. In one embodiment, a substrate is coated with a polymer material. Isolated sections are formed in the polymer material. The isolated sections are reflowed. The reflowed sections are formed into aspheric lens shapes using a lens stamp.

25 Claims, 4 Drawing Sheets

U.S. PATENT DOCUMENTS

2009/0325107 A1    12/2009    Oliver et al.

FOREIGN PATENT DOCUMENTS

| | | | |
|---|---|---|---|
| JP | 7-104106 A | * | 4/1995 |
| JP | 2000-031442 | | 1/2000 |
| JP | 2000-089002 | | 3/2000 |
| JP | 2004-226639 | | 8/2004 |
| JP | 2005-41125 A | | 2/2005 |
| JP | 2005-227699 | | 8/2005 |
| JP | 2005-258349 | | 9/2005 |
| JP | 2005-321710 | | 11/2005 |
| JP | 2006-126455 A | | 5/2006 |
| JP | 2006-253464 | | 9/2006 |
| JP | 2006-264001 | | 10/2006 |
| TW | 463217 B | | 11/2001 |
| WO | WO 01/62400 A2 | | 8/2001 |

OTHER PUBLICATIONS

English-language abstract of KR 641554 B1 (Nov. 2006).*

Suleski, Thomas et al., "Fabrication Trends for Free-Space Microoptics", Journal of Lightwave Technology, vol. 23, No. 2, pp. 633-646, Feb. 2005.

Volkel, R. et al., "Miniaturization of Imaging Systems", MST/MEMS for Production Engineering.

McCormick, M. et al. "Microengineering Design and Manufacture using the LIGA Process", Engineering Science and Education Journal, vol. #, Issue 6, pp. 255-262, Dec. 1994.

C. Tsou et al., "A New Method for Microlens Fabrication by a Heating Encapsulated Air Process" IEEE Photonics Technology Letters, vol. 18, No. 23, pp. 2490-2492, Dec. 1, 2006.

A. Stuck et al., "Mass Producible Integrated Micro-Optic Devices and Systems" Optical MEMS and Their Applications Conferences, 2006, IEEE/LEOS International Conference, Aug. 21-24, 2006, pp. 32-33. http://ieeexplore.org/iel5/11194/36055/01708250.pdf?tp=&isnumber=36055&arnumber=1708250&punumber=11194.

S-M. Kim et al., "Replication Qualities and Optical Properties of UV-Moulded Microlens Arrays" Journal of Physics D: Applied Physics, vol. 36, pp. 2451-2456, 2003.

W. Moench et al., "Fabrication and Testing of Micro-Lens Arrays by All-Liquid Techniques" Journal of Optics A: Pure and Applied Optics, vol. 6, pp. 330-337, 2004.

S. Wolf et al., "Lithography I: Optical Photoresist Materials and Process Technology" Silicon Processing for the VLSI Era, vol. 1-Process Technology, pp. 407-409 and 452-454, 1986.

Processing for the VLSI Era, vol. 1—Process Technology, pp. 407-409 and 452-454, 7986.

* cited by examiner

THERMAL EMBOSSING OF RESIST REFLOWED LENSES TO MAKE ASPHERIC LENS MASTER WAFER

FIELD OF THE INVENTION

Embodiments of the invention relate generally to the field of imaging devices, and more particularly to methods of forming lens masters for wafer level lens replication.

BACKGROUND OF THE INVENTION

Imaging devices, including charge coupled devices (CCD) and complementary metal oxide semiconductor (CMOS) circuits, among others, have commonly been used in photo-imaging applications. An imager circuit includes a focal plane array of pixels, each one of the pixels including a photosensor, for example, a photogate, photoconductor or a photodiode for accumulating photo-generated charge in the specified portion of the substrate.

Pixels in an imaging device function to collect light from a portion of a scene or image being captured by the imaging device. Lenses may be used to enhance the collection of light at various levels of the image capture process by focusing incoming light onto specific light-collecting portions of the device, thereby decreasing the amount of light lost and increasing the fidelity of the captured image. Accordingly, a microlens may be positioned above each pixel in a pixel array to focus incoming light on the photo-sensitive portion of the pixel. At a higher hardware level, an imaging device may further include one or more larger lenses positioned above the entire pixel array for imaging a scene onto the pixel array.

Lenses used in wireless telephones (e.g., cellular telephones) present a unique challenge. They must be compact, inexpensive, used with a digital pixel array and provide a high-quality picture. To achieve these goals, designers have used wafer-level optics (WLO), which involves packaging small lenses with the digital circuitry, including a pixel array. Currently, however, lenses used in WLO are highly aspheric, or "free form," often with aspheric coefficients of the 10th to 14th order. Lenses may be created at a wafer level using a "lens master wafer." A lens master wafer includes a plurality of lens-shaped dies. These lens shapes may be replicated in lens material on wafers to form lens wafers, which may then be used to form individual lens units for use with respective imaging devices.

One common way of forming a lens master wafer is to photodefine isolated sections in a polymer and reflow the sections to form lens shapes. The shape of the reflowed lens shapes is limited generally to ellipsoidal shapes using this method. In many cases, a different lens shape may be desired but cannot be achieved using this technique.

In an alternative method, lens shapes are formed using one or more single lens master stamps by, for example, precision diamond turning, and replicating the stamp shape through a step and repeat "stamp-and-step" method to populate an entire surface of the lens master wafer. Problems arise in the quality of the formed lens shapes, as the lens shapes suffer from variability and trapped air bubbles. Prior to stamping, the upper surface of the lens material layer is usually flat, which often contributes to the deformities and the inclusion of trapped air during the stamping process, resulting in imperfect formation of the desired lens shape. There is a need to minimize the variability in lens shapes across an area of a lens master wafer to be populated with lens with the required aspheric prescription shape.

DETAILED DESCRIPTION OF THE INVENTION

In the following detailed description, reference is made to the accompanying drawings which form a part hereof, and which illustrate specific embodiments of the invention. These embodiments are described in sufficient detail to enable those of ordinary skill in the art to make and use them. It is also understood that structural, logical, or procedural changes may be made to the specific embodiments disclosed herein.

Figure 1:
FIG. 1 is a cross-sectional side view showing a substrate.
Figure 2:
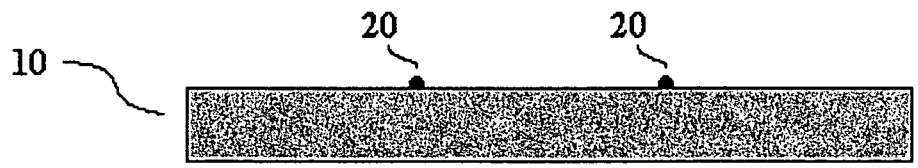
FIG. 2 is a cross-sectional side view showing the FIG. 1 substrate marked with alignment marks.

FIGS. 1-7 illustrate stages of a method of forming an aspheric lens master wafer for use in producing wafer level lenses, in accordance with one embodiment described herein. FIG. 1 shows a support substrate 10, which can be made of any supporting material, for example, metal, glass, polymer, silicon, ceramics or other suitable support material. FIG. 2 illustrates alignment marks 20 subsequently patterned on the substrate 10. The alignment marks, which may comprise metal, resist or some other suitable material, provide reference marks for aligning lens wafers stacked on top of the completed lens master wafer for manufacturing purposes.

Figure 3A:
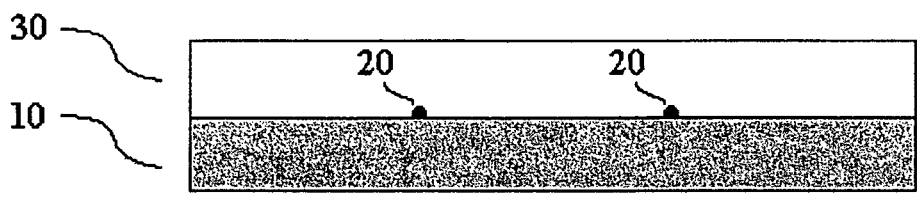
FIG. 3A is a cross-sectional side view showing the FIG. 2 substrate coated with a polymer layer.

The substrate 10 and marks 20 are then coated with a suitable lens material 30 as shown in FIG. 3A. Without being limiting, lens material 30 could be, for example, a photo-patternable lens polymer. The polymer reflows at temperature near glass transition temperatures due to surface tension effects. The thickness of the lens material 30 is set according to a predetermined amount based on the desired size of the to-be-formed lenses to provide the correct volume of material remaining after a subsequent patterning and isolation step (described below).

Figure 3B:
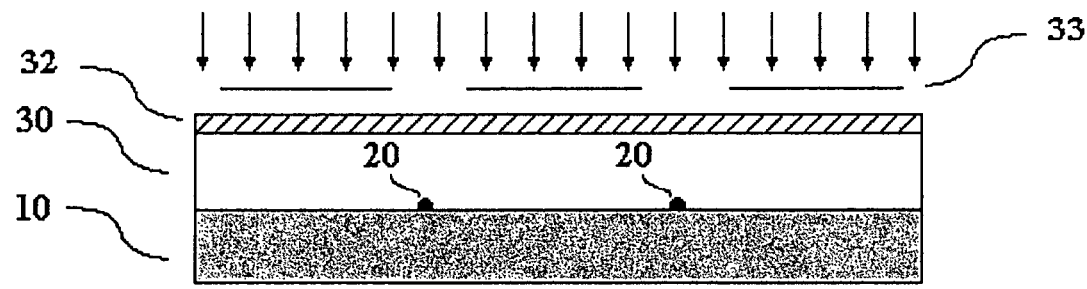
FIG. 3B is a cross-sectional side view showing the FIG. 3A substrate and polymer layer coated with a photoresist layer.
Figure 3C:
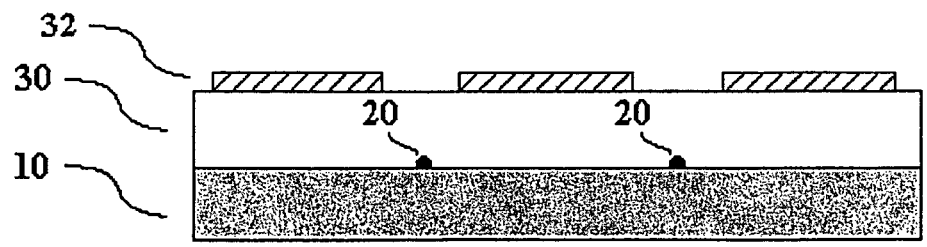
FIG. 3C is a cross-sectional side view showing the FIG. 3B substrate with the photoresist layer patterned to form etchable areas.
Figure 3D:
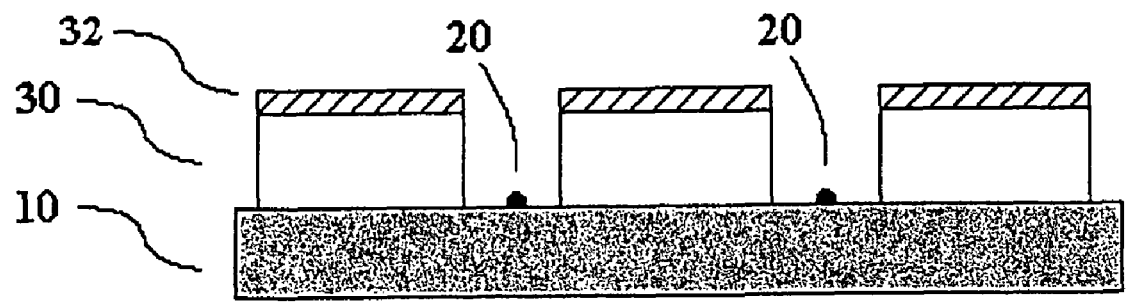
FIG. 3D is a cross-sectional side view showing the FIG. 3C substrate with the polymer layer etched to form a plurality of isolated sections.

Next, isolated sections are formed in the lens material 30. The isolated sections may be formed in various ways known in the art. Without being limiting, in one embodiment isolated sections are formed in the lens material 30 in a patterning and isolation step by coating the lens material 30 with a photoresist layer 32 and positioning a mask 33 above the photoresist layer 32 (FIG. 3B). The mask 33, which is patterned to form isolated sections, is exposed to light. The exposed areas of the photoresist 32 (FIG. 3C) are developed and cured to form isolated sections in the photoresist 32 and lens material 30 (FIG. 3D). Finally, the photoresist layer 32 is removed, leaving isolated sections 40 of lens material (FIG. 4).

Figure 4:
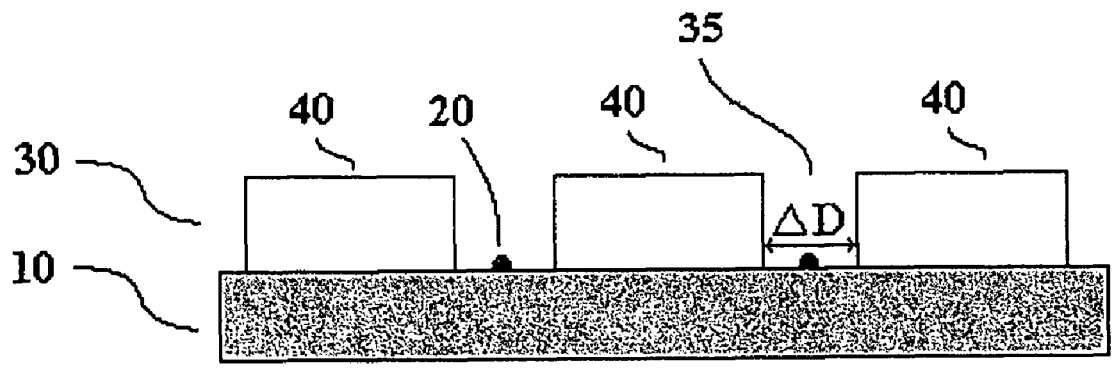
FIG. 4 is a cross-sectional side view showing a plurality of isolated sections formed on the FIG. 3D substrate and the photoresist layer removed.

FIG. 4 shows the substrate 10 after the patterning and isolation step. The lens material 30 is divided into isolated sections 40. The isolated sections may be, but not necessarily, formed in alignment with the alignment marks 20. Each isolated section 40 is separated by a gap 35 having a width ΔD. Width ΔD is determined according to the size and required position on a wafer of the intended lens assembly that is to be created. The size and shape of the isolated sections 40 are also selected to provide the correct volume of lens material 30 for the final to-be-formed lens shape. The size and shape of the isolated sections 40 may be uniform or vary across the surface of the lens master wafer.

Figure 5:
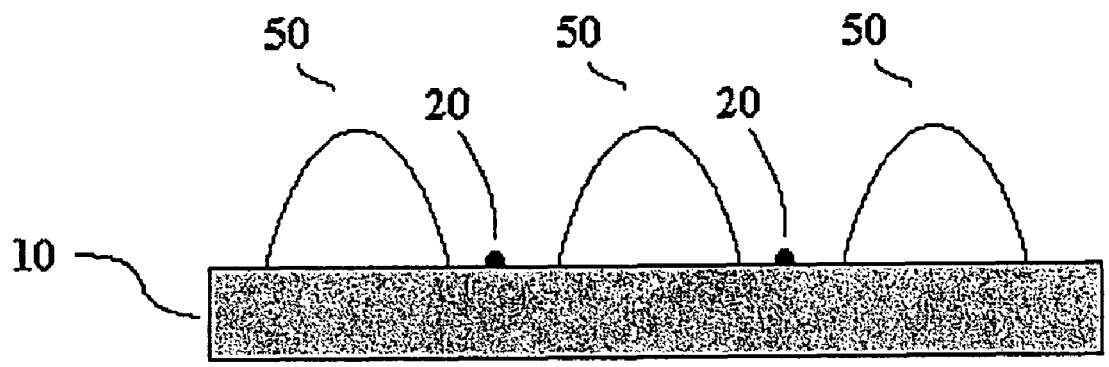
FIG. 5 is a cross-sectional side view showing a plurality of isolated reflowed lens shapes on the FIG. 4 substrate.

After the isolated sections 40 have been formed, they are reflowed to form spherical or ellipsoid reflowed sections 50, as shown in FIG. 5. The reflow process is well known in the art and may be carried out, for example, by heating the substrate 10 to raise the temperature of the isolated section 40. As the temperature approaches the melting point of the lens material 30, the isolated sections 40 will deform from rectangular shapes to spherical or ellipsoidal shaped reflowed sections 50.

Figure 6:
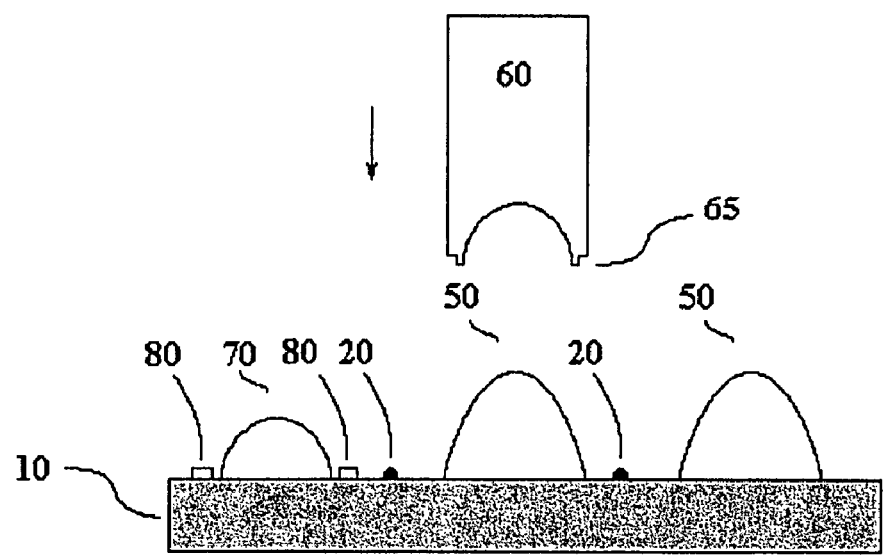
FIG. 6 is a cross-sectional side view showing a lens master stamp for forming aspheric lens shapes in reflowed lenses.

FIG. 6 shows a lens master stamp 60 used for stamping an aspheric lens shape into the reflowed sections 50. In one embodiment the lens master stamp is diamond turned for high precision shape and comprises stainless steel. The lens master stamp 60 and/or the substrate 10/reflowed sections 50 may be coated with a thin release material, for example, CYTOP®, to facilitate the separation of the stamped lens shapes and the stamp after the stamp molding step. Furthermore, the lens master stamp 60 and/or the substrate 10 may be heated during this stamp molding step. Preferably, the lens master stamp 60 alone is heated, as heating the substrate 10 might cause the reflowed sections 50 to deform further and increase lens shape variability. A suitable temperature for the lens master stamp 60 when, e.g., the lens material of the sections 30 is a polymer, is a temperature that is close to the glass transition temperature of the polymer.

During the illustrated stamping step, the lens master stamp 60 executes a series of "stamp-and-step" operations. First, the lens master stamp 60 is pressed into a reflowed section 50 to form an aspheric lens shape in accordance with the shape of the lens master stamp 60. In one embodiment, where the lens material 30 comprises AZ40xt-11® resist, to form a lens shape of a size ranging from 5 μm-10 μm, the stamp 60 is heated to 120°-140° and applied with 1N of force for approximately 10 seconds. The precise time, force and temperature of the stamping press may vary depending on the composition of the lens material 30 and the size of the lens shapes 70 to be formed.

After the stamping press is complete, the lens master stamp 60 is removed from the now aspheric lens-shaped isolated section, (i.e., lens shape 70) and shifted over to a yet unstamped reflowed section 50. The lens master stamp 60 is again pressed into a reflowed section 50, and the process is repeated until all reflowed sections 50 have been transformed into aspheric lens shapes 70. The lens master stamp 60 may be maintained at a constant temperature or the temperature may be cycled up during the "stamping press" step and permitted to cool down during the "stepping" step.

Figure 7:
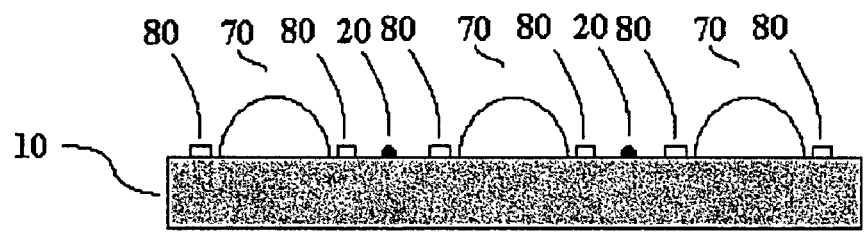
FIG. 7 is a cross-sectional side view showing a plurality of aspheric lens shapes formed on the FIG. 6 substrate.

Due to the distance ΔD between the isolated sections 40 allotted during the isolation step, space is available for lens material displaced during the stamping step, so that the shapes of neighboring lens shapes 70 are not disrupted. The lens master stamp 60 may also include notches 65 to facilitate containing excess lens material 80 during the stamping process. FIG. 7 shows a completed set of aspheric lens shapes 70 formed using the above described methods.

The lens master stamp 60 is described as shifting to a neighboring reflowed section 50, however, it may be shifted to any other reflowed section 50. Furthermore, a single lens master stamp 60 is shown for illustrative convenience only. Multiple lens master stamps 60 may be employed, each having the same or differing sizes and each stamping a same or different predetermined pattern of isolated sections. Thus, the size of the aspheric lens shapes 70 may vary or be uniform across a wafer.

To further avoid the inclusion of air bubbles in the aspheric lens shapes 70, the stamping press step may be executed in a low air pressure environment or in a vacuum. The lenses 70 may optionally be cured individually (as shown in FIG. 6) or collectively undergo heat treatment during or after the stamping press process.

Figure 8:
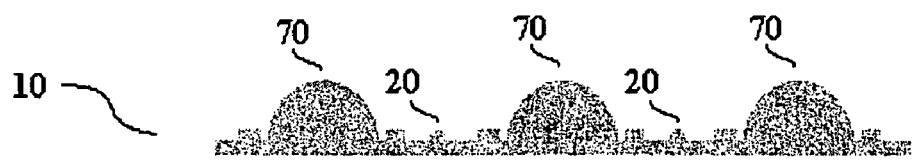
FIG. 8 is a cross-sectional side view showing a substrate having aspheric lens shapes and alignment marks etched therein.

After the aspheric lens shapes 70 have been formed across the master wafer, the lenses 70 and alignment marks 20 may be optionally etched into the underlying substrate 10 by plasma etching, dry etching or other known techniques to form a substrate 10 as shown in FIG. 8 having aspheric lens shapes 70. One advantage to etching the aspheric lens shapes 70 into the substrate 10 is the formation of a sturdier master wafer that will sustain more use without deformation than the lens material aspheric lens shapes 70.

Figure 9:
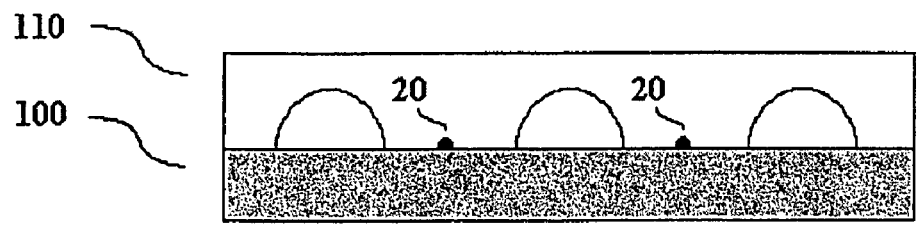
FIG. 9 is a cross-sectional side view showing a lens master wafer coated with a plating film material.
Figure 10:
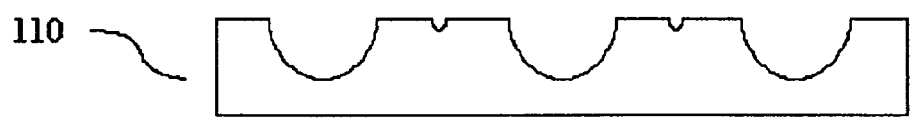
FIG. 10 is a cross-sectional side view showing a portion of an intermediate negative of the lens master wafer of FIG. 9.

The completed lens master wafer as shown in FIG. 7 or FIG. 8 may be used to create wafer level lenses by first forming an intermediate negative 110, as shown in FIGS. 9 and 10. The intermediate negative 110 may be formed in any of various ways known in the art. In one embodiment, a plating film is deposited over the lens master wafer and removed to form the intermediate negative 110 (FIG. 9). The plating film may comprise nickel or some other suitable material. Alternatively, in another embodiment the lens master wafer 100 may be used to form an intermediate negative 110 by depositing an ultraviolet curable or thermally curable polymer material onto the lens master wafer and replicating the aspheric lens shapes using known replication techniques.

Figure 11:
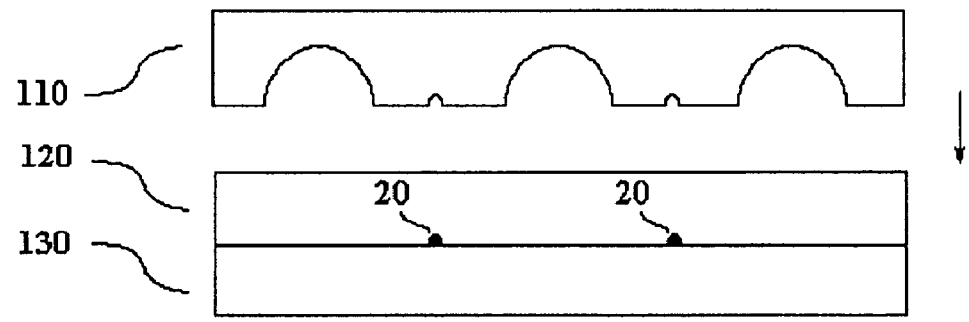
FIG. 11 is a cross-sectional side view showing the intermediate negative of FIG. 10 being used to create lenses.
Figure 12:
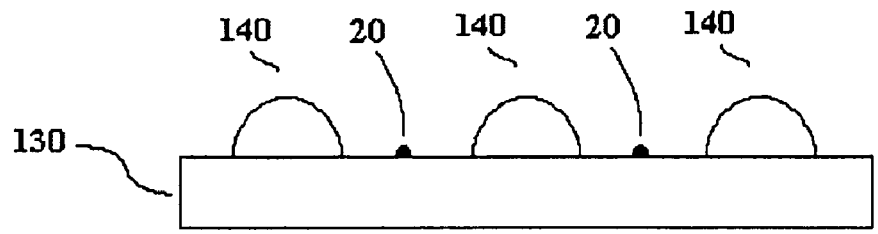
FIG. 12 is a cross-sectional side view of lenses created by the intermediate negative of FIG. 10.

As shown in FIG. 11, the intermediate negative 110 may then be used as a sub-master for forming positive optical lenses for use in imager devices. The intermediate negative 110 is pressed into a lens material 120 formed over a transparent substrate 130 in alignment with alignment marks 20 formed on the transparent substrate 130. FIG. 12 shows completed aspheric lenses 140 formed on the substrate 130.

While embodiments have been described in detail, it should be readily understood that they are not limited to the disclosed embodiments. Rather the embodiments can be modified to incorporate any number of variations, alterations, substitutions or equivalent arrangements not heretofore described

What is claimed as new and desired to be protected by Letters Patent of the United States is:

1. A method of forming a lens master wafer, comprising:
   forming a material portion on a substrate;
   forming a plurality of isolated sections in the material portion;
   reflowing the isolated sections; and
   stamping the reflowed sections with a lens stamp to form an aspheric lens shape in each of the reflowed sections.

2. The method of claim 1, wherein the material portion comprises a polymer.

3. The method of claim 2, wherein the plurality of isolated sections are formed using a mask and by exposing, developing, and curing the polymer to form the plurality of isolated sections.

4. The method of claim 1, wherein the reflowed sections have an ellipsoid shape and the aspheric lens shape is formed by stamping the ellipsoid shaped sections with the lens stamp while the substrate and material portion are in a vacuum environment.

5. The method of claim 1, wherein multiple aspheric lens shapes of differing sizes are formed using multiple lens stamps.

6. The method of claim 1, further comprising heating the lens stamp while forming the aspheric lens shapes.

7. The method of claim 1, further comprising heating the substrate while forming the aspheric lens shapes in the polymer.

8. The method of claim 1, further comprising forming an intermediate negative plating film of the lens master wafer.

9. The method of claim 8, wherein the intermediate negative plating film comprises nickel.

10. The method of claim 8, further comprising using the intermediate negative plating film to form lenses.

11. The method of claim 1, further comprising etching the aspheric lens shapes into the substrate.

12. The method of claim 1, further comprising:
    depositing an ultraviolet curable material onto the lens master wafer; and
    curing the ultraviolet curable material using ultraviolet light exposure to form an intermediate negative of the lens master wafer.

13. A method of forming a lens master wafer, comprising:
    coating a substrate with a photo-patternable polymer of a predetermined thickness;
    coating the polymer with a photoresist;
    patterning the photoresist to form etchable areas in the polymer;
    etching the polymer using the patterned photoresist to form a plurality of isolated sections;
    removing the photoresist;
    reflowing the isolated sections to form ellipsoidal shaped sections; and
    stamping each of the ellipsoidal shaped sections with a lens stamp to form an aspheric lens shape.

14. The method of claim 13, further comprising etching the aspheric lens shapes into the substrate.

15. The method of claim 13, wherein the substrate is heated during the formation of the aspheric lens shapes.

16. The method of claim 13, wherein the lens stamp is heated during the formation of the aspheric lens shapes.

17. The method of claim 13, wherein the aspheric lens shapes are formed in a low air pressure environment.

18. The method of claim 13, wherein the aspheric lens shapes are formed in a vacuum environment.

19. The method of claim 13, wherein the aspheric lens shapes are formed to be uniform in size.

20. The method of claim 13, wherein multiple lens stamps of varying sizes are used to form the aspheric lens shapes in varying sizes.

21. The method of claim 13, wherein the aspheric lens shapes are each cured individually by ultraviolet light exposure during the stamping process.

22. The method of claim 13, wherein the aspheric lens shapes are cured collectively by heat treatment after the stamping process is complete.

23. The method of claim 13, wherein the aspheric lens shapes are cured collectively by ultraviolet light exposure after the stamping process is complete.

24. The method of claim 23, further comprising curing the aspheric lens shapes collectively by heat treatment.

25. The method of claim 13, further comprising:
    depositing an ultraviolet curable material over the aspheric lens shapes; and
    exposing the ultraviolet curable material to ultraviolet light to form aspheric lens shapes.

* * * * *